(12) United States Patent
Faska et al.

(10) Patent No.: US 7,620,330 B2
(45) Date of Patent: Nov. 17, 2009

(54) OPTICAL RECEIVER DEVICE AND METHOD

(76) Inventors: Tom Faska, 54 Mason Rd., Brookline, NH (US) 03033; Robert Martin, 4510 Fontana St., Orlando, FL (US) 32807

( * ) Notice: Subject to any disclaimer, the term of this patent is extended or adjusted under 35 U.S.C. 154(b) by 578 days.

(21) Appl. No.: 10/456,388

(22) Filed: Jun. 5, 2003

(65) Prior Publication Data

US 2006/0120731 A1 Jun. 8, 2006

(51) Int. Cl.
*H04B 10/06* (2006.01)

(52) U.S. Cl. .................. 398/202; 398/208; 398/214; 398/135; 250/214 A; 250/214 C; 250/214 R; 250/214 LA; 385/89; 385/90; 385/92; 385/93; 330/59; 330/308

(58) Field of Classification Search ............... 398/202, 398/214, 208, 135, 141, 136, 118, 119, 128, 398/130; 250/214 A, 214 C, 214 R, 214 LA; 385/89, 90, 92, 93; 330/59, 308
See application file for complete search history.

(56) References Cited

U.S. PATENT DOCUMENTS

| | | | | |
|---|---|---|---|---|
| 4,096,512 A | * | 6/1978 | Polinsky | 257/435 |
| 5,410,145 A | * | 4/1995 | Coroy | 250/214 C |
| 6,157,035 A | * | 12/2000 | Kuijk et al. | 250/370.14 |
| 6,841,771 B2 | * | 1/2005 | Shimizu | 250/214 A |
| 2002/0191263 A1 | * | 12/2002 | Hoang et al. | 359/189 |

* cited by examiner

Primary Examiner—Hanh Phan

(57) ABSTRACT

An optoelectronic device has a bright detector and a dark detector and reduces noise in the output of the bright detector using the output of the dark detector.

23 Claims, 8 Drawing Sheets

OPTICAL RECEIVER DEVICE AND METHOD

FIELD OF THE INVENTION

The present invention relates to optical receivers and, more particularly, to the reducing of parasitic noise in optical receivers.

BACKGROUND

When an optical photodetector receives light from a light source, for example light emitting from the end of an optical fiber, the photodetector typically generates a current or voltage indicative of the light received. This voltage or current is then either used directly or converted by certain electronic circuitry into either digital or analog signals. This process, is often used in, for example, data transmission.

In practice however, other factors affect the output of a photodetector. For example, even in the absence of light, photodetectors generate current. This is because some photodetectors, for example, p-I-n photodiodes are essentially diodes that have a small electrical leakage current, especially under reverse bias. This leakage current introduces noise into the output of the photodetector at both DC and AC frequencies. In addition, heat and quantum mechanical tunneling effects can also generate free electrons in the photodetector causing or contributing noise. Other noise types, for example, 1/f noise, which is present in most electrical elements, can similarly be present in the output of the photodetector.

The sum of the above noise components and/or others (referred to herein generically as parasitic noise) will detrimentally affect the photodetector output and can limit the ability to determine what the digital logic level of a given output of a photodetector actually is, especially at low optical powers.

FIG. 1 illustrates an ideal output signal 100 from an ideal photodetector (not shown), where a level in excess of a particular threshold 120 specifies a logic "1" and below a second threshold 140 specifies a logic "0".

FIG. 2 illustrates a more realistic depiction of a similar signal 200 to the signal 100 of FIG. 1 as it might be output by a more realistic photodetector (not shown). As shown, the signal 200 is slightly distorted as a result of noise 220, such as noted above. Nevertheless, since the optical power of the data-containing light received by the photodetector (reflected in the overall amplitude of the signal) is large relative to the noise, the ability to distinguish a logic "1" and "0" level is not affected. In other words, the effect of the noise on the error rate will be relatively small.

FIG. 3 illustrates a signal 300, similar to the signals 100, 200 of FIG. 1 or FIG. 2, in the case where the optical power of the data-containing light received much smaller relative to the noise level. As a result, distinguishing between a logic "1" and a logic "0" level is more difficult.

In general, the higher the noise level relative to the overall optical power of the data signal, the lower the receiver "sensitivity". Stated another way, the higher the noise level, the higher the received optical power for the data must be in order to get error free data transmission.

SUMMARY OF THE INVENTION

We have developed a way to counteract or reduce parasitic noise from a data signal output by a photodetector resulting from received light containing an optical data signal.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

In overview, we use a combination of photodetectors which do not absorb any light in conjunction with photodetectors that receive a data-carrying light beam for the purpose of nullifying or nearly nullifying parasitic noise. By ensuring that a photodetector that receive a data-carrying light beam (interchangeably referred to for simplicity as a "bright" or "light" detector) is located physically close to another substantially identical photodetector that can not absorb light (referred to for simplicity as a "dark" detector), the dark detector will experience significantly similar effects to that of the bright detector. As a result, the dark detector will generate an output resembling the non-data component of the output of the bright detector. Thus, by subtracting the dark detector output from the bright detector output, the effect of non-data components, such as parasitic noise, can be accounted for. Notably, as used herein, the proximity of a dark detector to any relevant bright detector(s) should, as noted above, be sufficiently close so as to maximize the likelihood that the dark detector will experience similar parasitic noise creating effects to that of the relevant bright detector(s). The two are considered sufficiently close when this is the case. However, a reasonable rule of thumb is that the devices will typically be no more than one hundred device widths apart, although they could be greater for some specific devices. In some applications, the particular limit to what is sufficiently "close" will not comport with the rule of thumb, but will be readily determinable by making a few examples having different spacings and, for each example, comparing the outputs of both the bright and dark detect detector outputs to each other while no light is applied to (or light is blocked from reaching) the bright detector and selecting the one most suitable under the applicable engineering and/or design constraints in effect.

FIG. 4 through FIG. 7 illustrate, in simplified fashion, the process of creating the relevant portion of an optical receiver implementing the invention.

Figure 1:
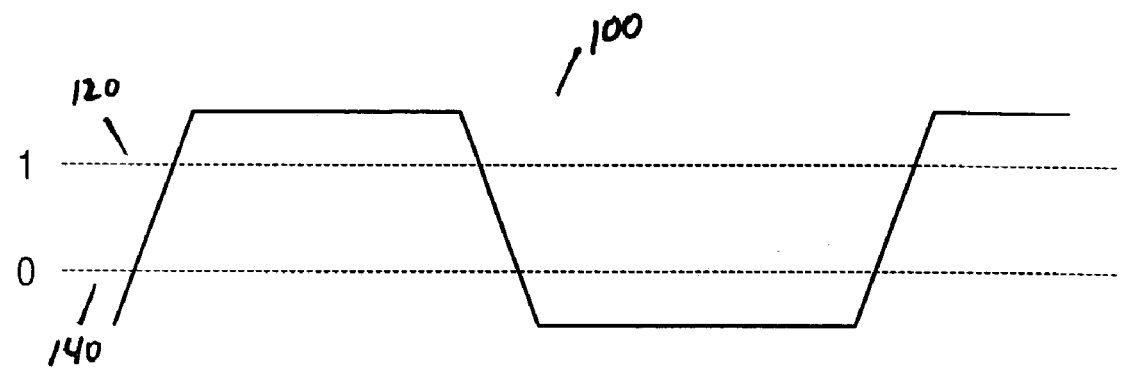
FIG. 1 illustrates an ideal output signal from an ideal photodetector.
Figure 2:
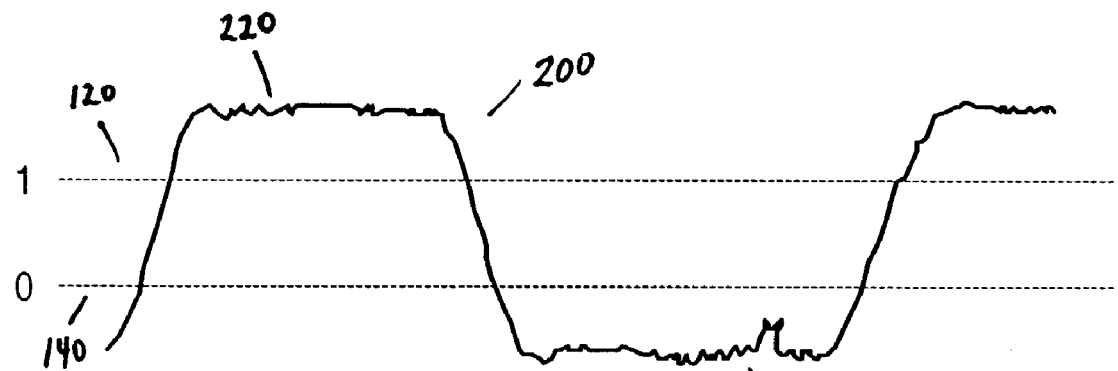
FIG. 2 illustrates a more realistic depiction of a similar signal to the signal of FIG. 1.
Figure 3:
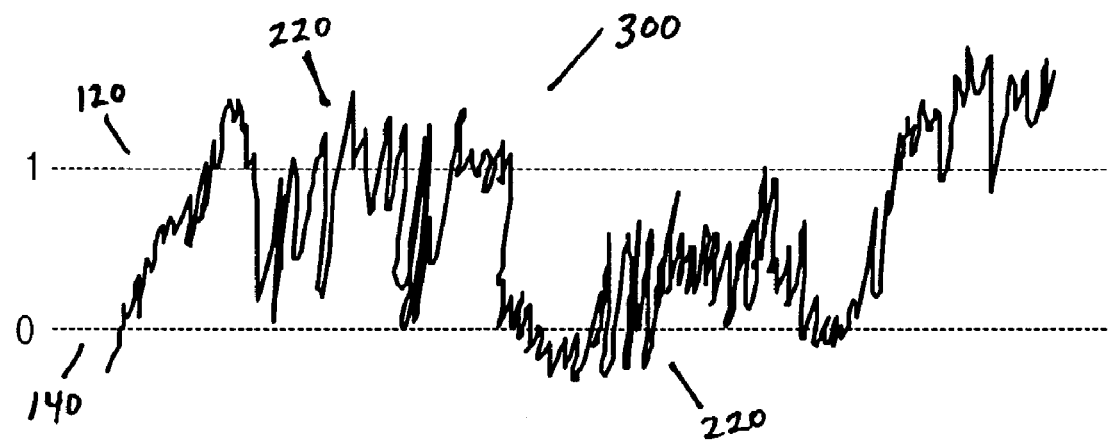
FIG. 3 illustrates a signal in the case where the optical power of the data-containing light received much smaller relative to the noise level.
Figure 4:
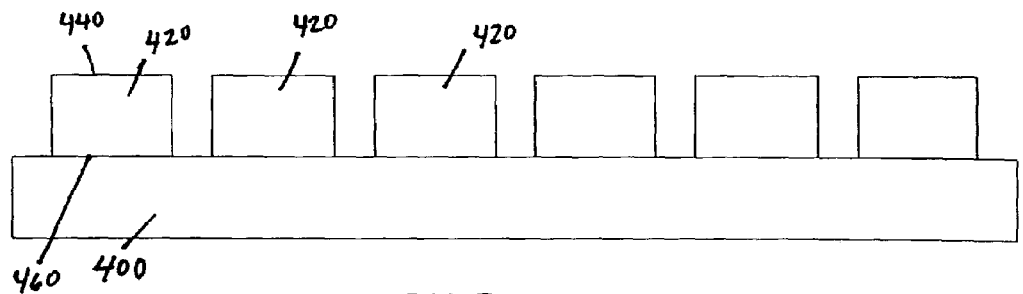
FIG. 4 illustrates in simplified fashion, the process of creating the relevant portion of an optical receiver implementing the invention.

FIG. 4 is a side view (not to scale) of a portion of a wafer substrate 400 containing multiple photodetectors 420 formed thereon or attached thereto. It should be understood that the wafer substrate 400 could also contain other elements, for example, lasers, modulators, circuits, etc. However, for purposes of understanding the invention, the presence or absence of any other elements is irrelevant and hence, will not be mentioned further. Depending upon the particular implementation, the photodetectors 420 can be of the type where light is received on a side 440 opposite to the side 460 where each photodetector 420 connects to the substrate 400 (referred to herein as a "top" or "topside" receiving photodetector) or of the type where light is received via the substrate side 460 referred to herein interchangeably as a "back", "backside" or "bottom" receiving photodetector). For purposes of explanation, the photodetectors 420 of FIG. 4 are substantially identical (i.e. within formation/manufacturing tolerances) bottom receiving photodetectors.

Figure 5:
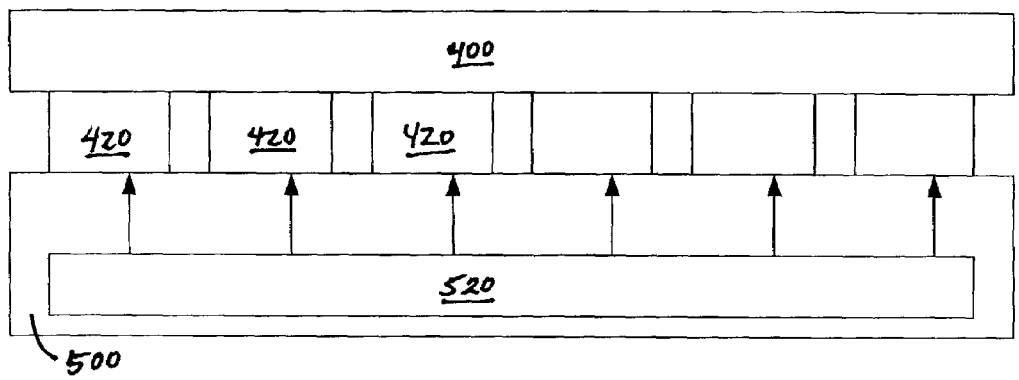
FIG. 5 illustrates in simplified fashion, the process of creating the relevant portion of an optical receiver implementing the invention.

FIG. 5 is an illustration of the photodetectors 420 of FIG. 4 after they have been hybridized with a semiconductor chip 500 containing control circuitry 520 for those devices 500, for example, by applying either conventional techniques, or teachings from commonly assigned U.S. patent application Ser. Nos. 09/896,189, 09/896,665, 09/896,983, 09/897,158 or 09/897,160 the entirety of which are incorporated herein by reference.

Figure 6:
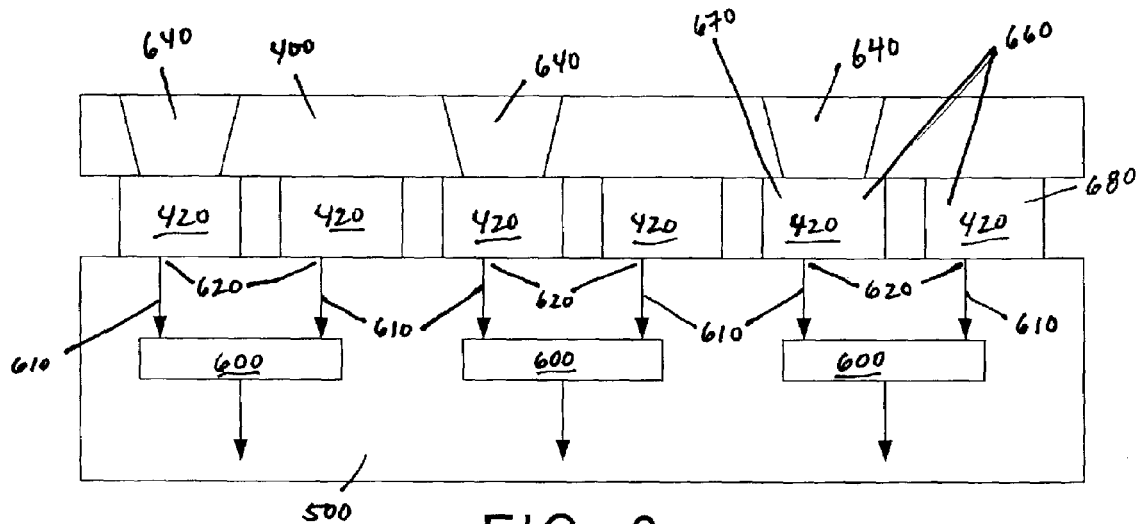
FIG. 6 illustrates in simplified fashion, the process of creating the relevant portion of an optical receiver implementing the invention.

FIG. 6 illustrates the basic components of FIG. 5, excluding the control circuitry 520. In addition, the semiconductor chip 500 also includes "subtractor" circuitry 600 and electrical connections 610 between each photodetector output 620 and the subtractor circuitry 600. In addition, an opening 640 has been formed in the substrate 400 over, in this example, one of a pair 660 of the photodetectors 420. The pairing and creation of the opening establishes one of the photodetectors 670 in the pair 660 as a bright detector and the other photodetector 680 in the pair 660 (by virtue of it's still being covered by the opaque substrate and hence, unable to receive light) as a dark detector. In addition, the pairing is made in such a manner so that both are very close to each other to ensure that they are ideally subject to the same location-related parasitic effects.

As noted above, the respective outputs 620, 622 of both the bright detector 670 and the dark detector 680 are connected to a common subtractor circuit 600. The subtractor circuit 600 is used to subtract a signal output by the dark detector 680 from a signal output by the bright detector 670 Depending upon the particular photodetector used, the output can be a voltage signal or a current signal. The specific subtractor circuit for the particular implementation will therefore be dependent upon the photodetectors used. For purposes of example, the subtractor circuit 600 can be implemented using a differential amplifier. In addition, depending upon the particular implementation, the subtractor circuit(s) can be implemented from discrete components or on a separate chip, instead of being a part of the control chip(s).

Optionally, the side of the substrate opposite the receiving side of the photodetectors of FIG. 6 can be further coated with a light absorbing material in order to eliminate, or minimize the possibility of detrimental effects, for example "crosstalk" caused by light reflections off of the substrate. Depending upon the particular instance, this optional light absorbing coating can be applied before the openings are made or after the openings are made, the former being the more likely case for most applications.

Figure 7:
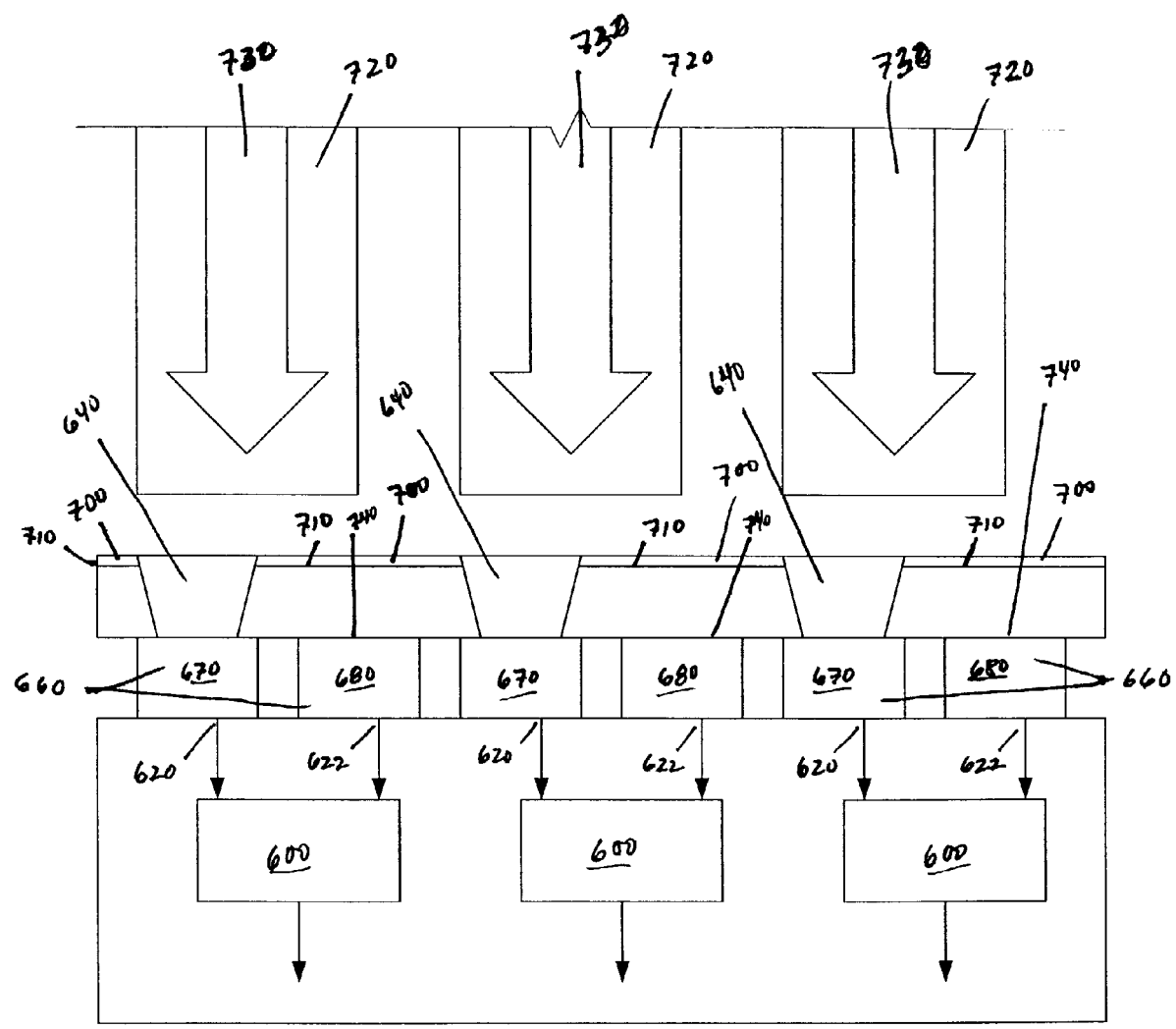
FIG. 7 illustrates in simplified fashion, the process of creating the relevant portion of an optical receiver implementing the invention.

FIG. 7 illustrates an optical receiver similar to that described in connection with FIG. 4 through FIG. 6, in an example intended environment, except the substrate of FIG. 7 contains a non-reflective (i.e. light absorbing) material 700 on its upper surface 710. As shown, each bright/dark detector pair 660 is associated with an individual optical fiber 720 through which a data-containing light beam 722, directed towards the optical receiver, can pass. Once it leaves the fiber 720, at least a portion of the light beam 730 will reach the bright detector 670 via the access opening 640. Any light striking above the dark detector 680 however, will not reach its receiving surface 740. The non-reflective material 700 helps to ensure light does not back-propogate into the fiber 720 or cause cross-talk interference with light from another fiber.

The output 620 of the bright detector 670 is connected to the subtractor circuitry 600, as is the output 622 of the dark detector 680. The close proximity of the bright detector 670 to the dark detector 680 maximizes the likelihood that the parasitic noise on the output of each is the same. As a result, the subtractor circuitry 600 removes noise common to both detectors and outputs a "cleaner" or noise reduced data signal.

Figure 8:
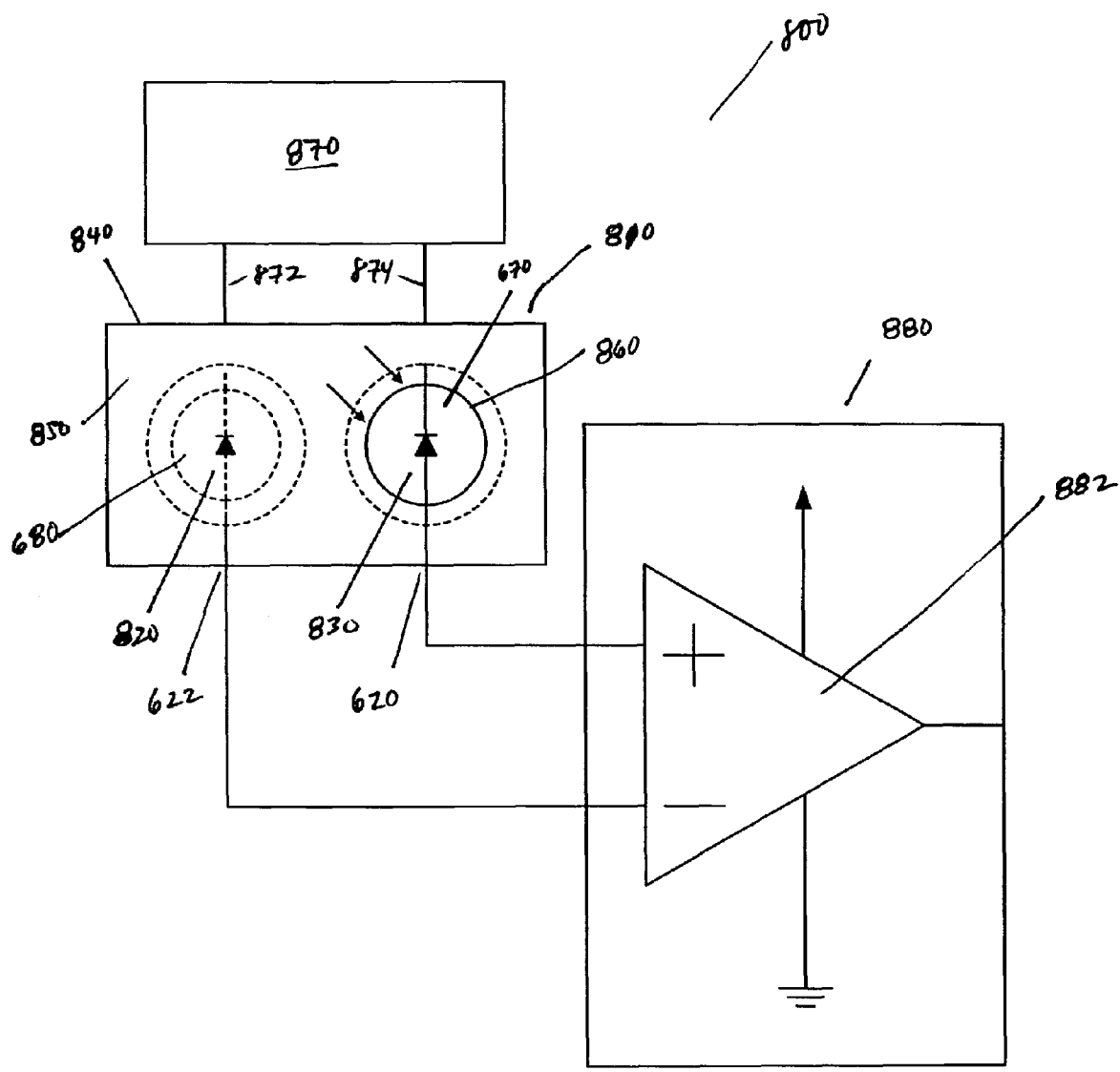
FIG. 8 illustrates an alternative simplified example of an optical receiver system implementing the invention.

FIG. 8 illustrates an alternative simplified example of an optical receiver system 800 implementing the invention. In this implementation, an optical chip 810, comprising a pair of p-I-n photodiodes 820, 830 grown on a common substrate 840 serve as photodetectors. An opaque cover 850 is mounted over the photodiodes 820, 830. An optical access opening 860, formed over one of the photodiodes 830, by laser drilling in this example, prior to the cover 850 being mounted over the photodiodes 820, 830, establishes the photodiode 830 on the right as the bright detector and the photodiode 820 on the left as the dark detector.

The optical chip 810 is connected to an electronic chip 870 via wirebond 872, 874 type connections (only two of which are shown for illustration purposes). Of course other type chip-to-chip connections could readily be used. The electronic chip 870 comprises the pertinent circuitry to, for example, control the operation of the photodetectors 820, 830. A third chip 880 comprises a differential amplifier circuit 882 (shown in simplified form), coupled to the respective outputs 622, 620 of the dark 680 and bright 670 detectors. This chip 880 is used as the subtractor circuit so that any signal from the output 622 of the dark detector 680 will be subtracted out of a signal from the output 620 of the bright detector 670.

Up to now, the above description has focussed on a basic configuration for purposes of aiding understanding the operation of the invention. However, it should be appreciated that numerous more complex configurations can be constructed. The following discussion provides a few additional illustrative configurations to provide a sense of the myriad of configurations that are possible.

Figure 9:
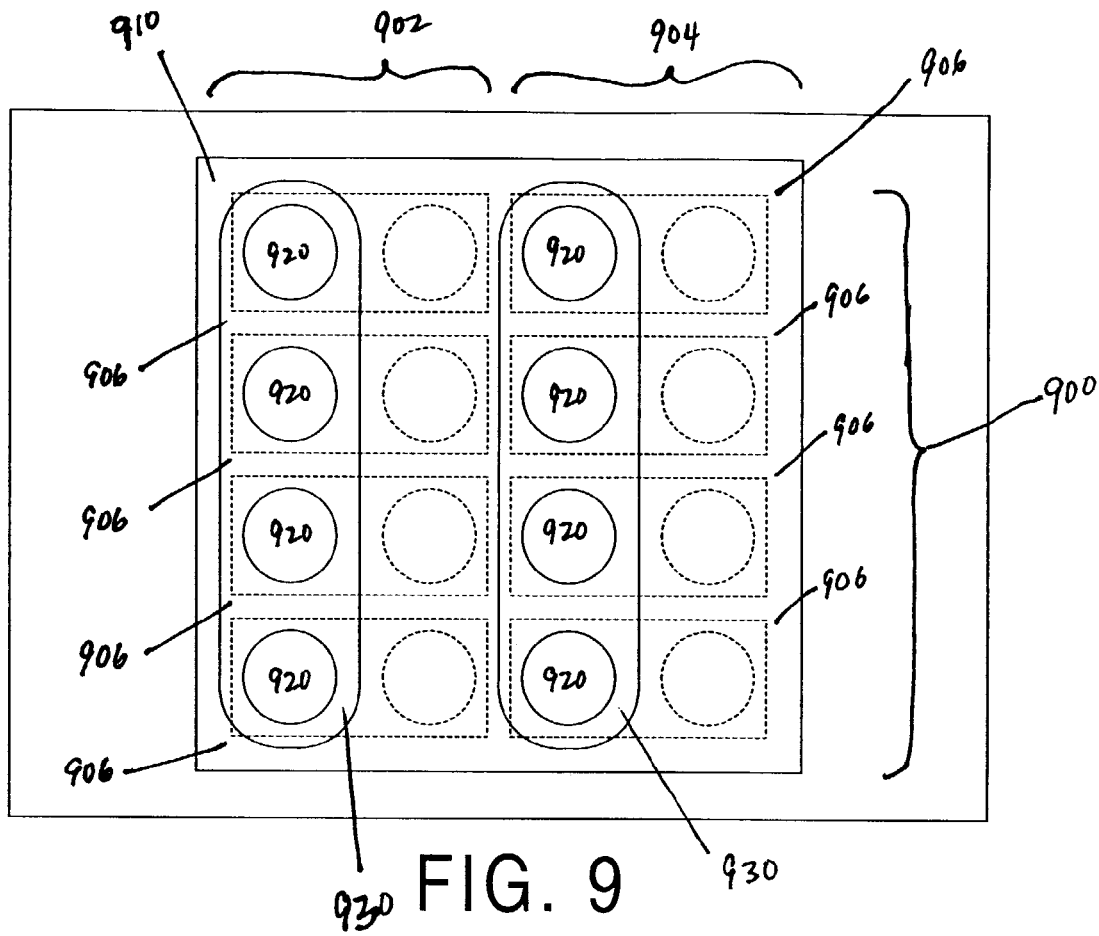
FIG. 9 illustrates a top view of an optical detector configuration for use in an optical receiver.

FIG. 9 illustrates a top view of an optical detector configuration similar to that of FIG. 6 or FIG. 7, for use in an optical receiver. The pertinent illustrated component is an array of sixteen photodetectors 900 arranged in two columns 902, 904 of four pairs 906. However, instead of having individual openings in the cover 910 to provide the optical access, the bright detectors 920 are arranged in a line so that a larger access opening 930 can be formed in the cover 910, for example, using a patterning and etching technique suitable for the particular cover material.

Figure 10:
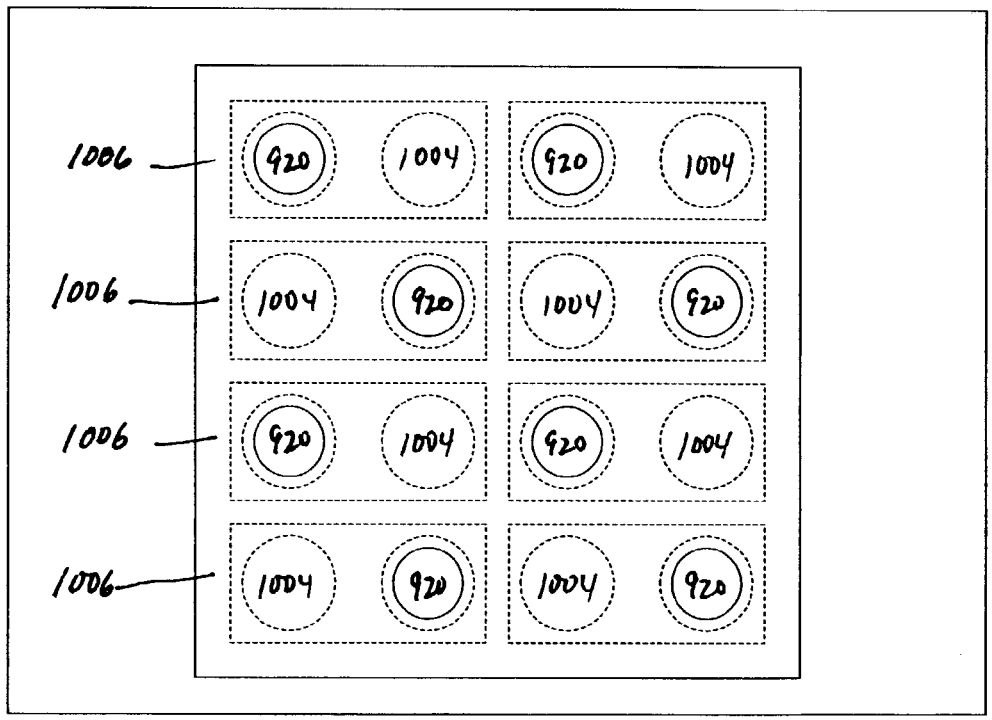
FIG. 10 illustrates a top view of the pertinent portion of an optical detector configuration.

FIG. 10 illustrates a top view of the pertinent portion of an optical detector configuration similar to that of FIG. 9 except, in this example, the positions of the bright detectors 920 and dark detectors 1004 alternate in each row 1006. Although this configuration requires individual access ways 1008 be formed, it has the advantage that it "spreads out" the bright detectors 920, thereby reducing the possibility of cross-talk. In addition, since each dark detector 1004 is "surrounded" by bright detectors 920, parasitic noise induced in one photodetector by combinatorial effects relating to the operation of surrounding photodetectors, if any, can be better accounted for in some implementations.

Figure 11:
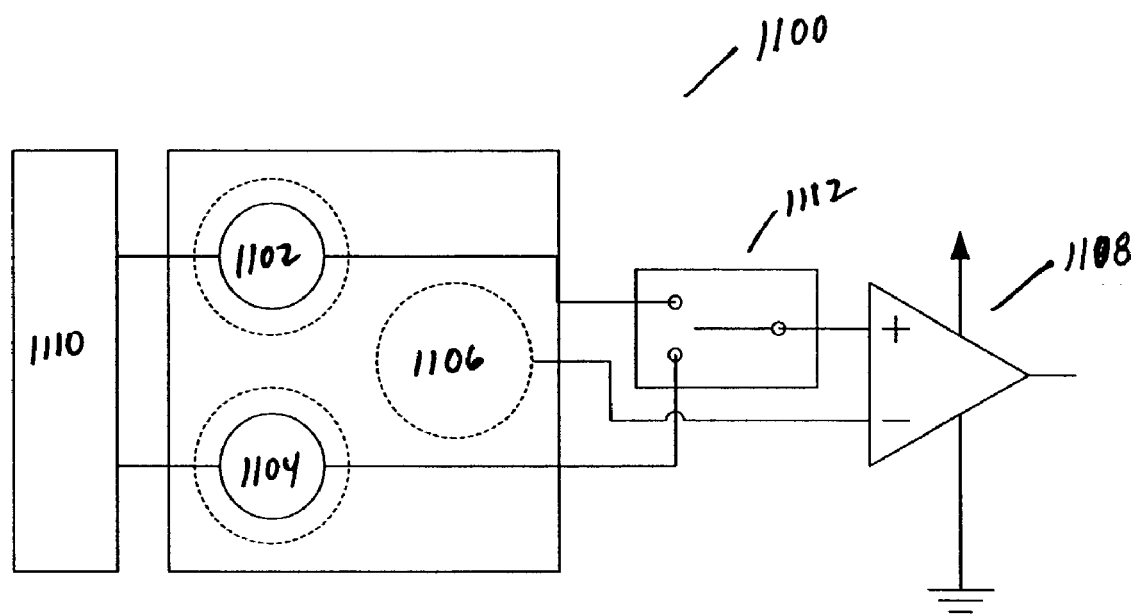
FIG. 11 illustrates, in simplified fashion, a top view of the pertinent portion of an alternative optical detector configuration.

FIG. 11 illustrates, in simplified fashion, a top view of the pertinent portion of an alternative optical detector configuration 1100 for use in an optical receiver. As shown in FIG. 11, a redundant pair of photodetectors 1102, 1104 (implemented, for example, by applying the teachings of commonly assigned U.S. patent application Ser. No. 09/896,797, incorporated herein by reference in its entirety) serve as bright detectors. The bright detectors 1102, 1104 both share a common data-containing light source (not shown) and a single dark detector 1106. In this configuration, the respective outputs of each of the redundant photodetectors 1102, 1104 is connectable to the subtractor circuit 1108 represented for purposes of illustration only, as a differential amplifier but only one bright detector 1102, 1104 can be active at a time. Depending upon the particular implementation, using well known signal selection techniques, the selection can be made by the control circuitry 1110 for the bright detectors 1102, 1104, on the output side (using some form of switching or XORing of the outputs 1112) or, in many cases, both.

Figure 12:
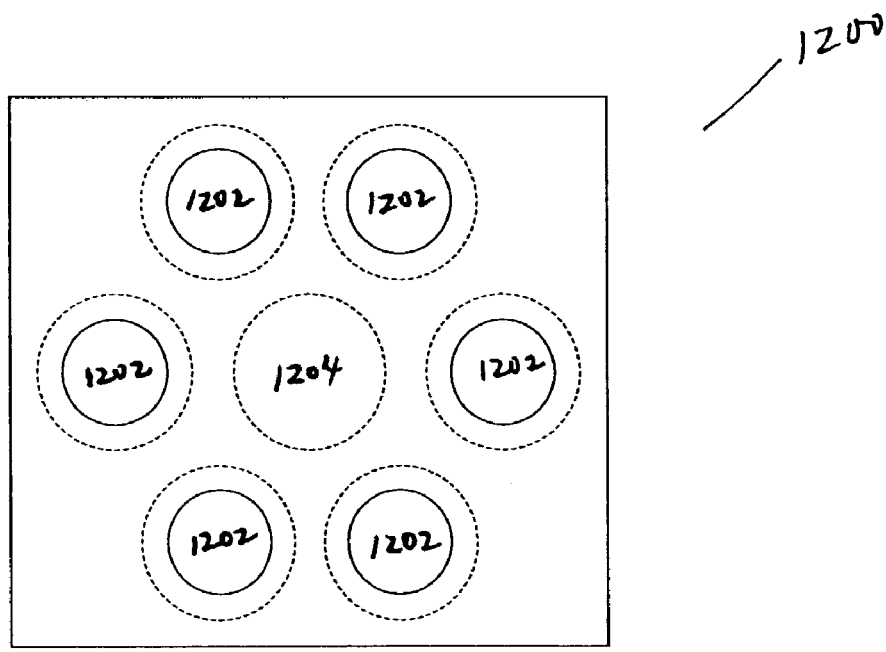
FIG. 12 illustrates, in simplified fashion, a top view of the pertinent portion of another alternative optical detector configuration.

FIG. 12 illustrates, in simplified fashion, a top view of the pertinent portion of another alternative optical detector configuration 1200 for use in an optical receiver. In the implementation represented in FIG. 12, six bright detectors 1202 share a common (in this case centrally placed) dark detector 1204. Depending upon the particular implementation, this versatile physical configuration could be set up, for example, through sizing or using control circuitry, so that: a) each bright detector is associated with a single data-containing light signal (i.e. in a 1:1 relationship); b) the bright detectors are paired 1206 (with each pair using redundancy as with FIG. 11) but all share the central dark detector 1204 (i.e. an effective 3:1 relationship); c) a set of three adjacent 1208 bright detectors 1202 forming a redundant group such that there are two groups sharing the central dark detector 1204; or d) all six bright detectors 1202 making up a single redundant group such that only one of the six will be operational as a bright detector at a time.

Of course, depending upon the specific arrangement, the use of two or more subtractor circuits may be necessary.

In all the examples described in connection with FIG. 12, the output of the single dark detector 1204 would be connected to the subtractor circuit(s) (for simplicity, not shown) in such a way that whichever bright detector(s) were active, the output of the dark detector 1204 would be subtracted from the output of the pertinent bright detector(s).

Figure 13:
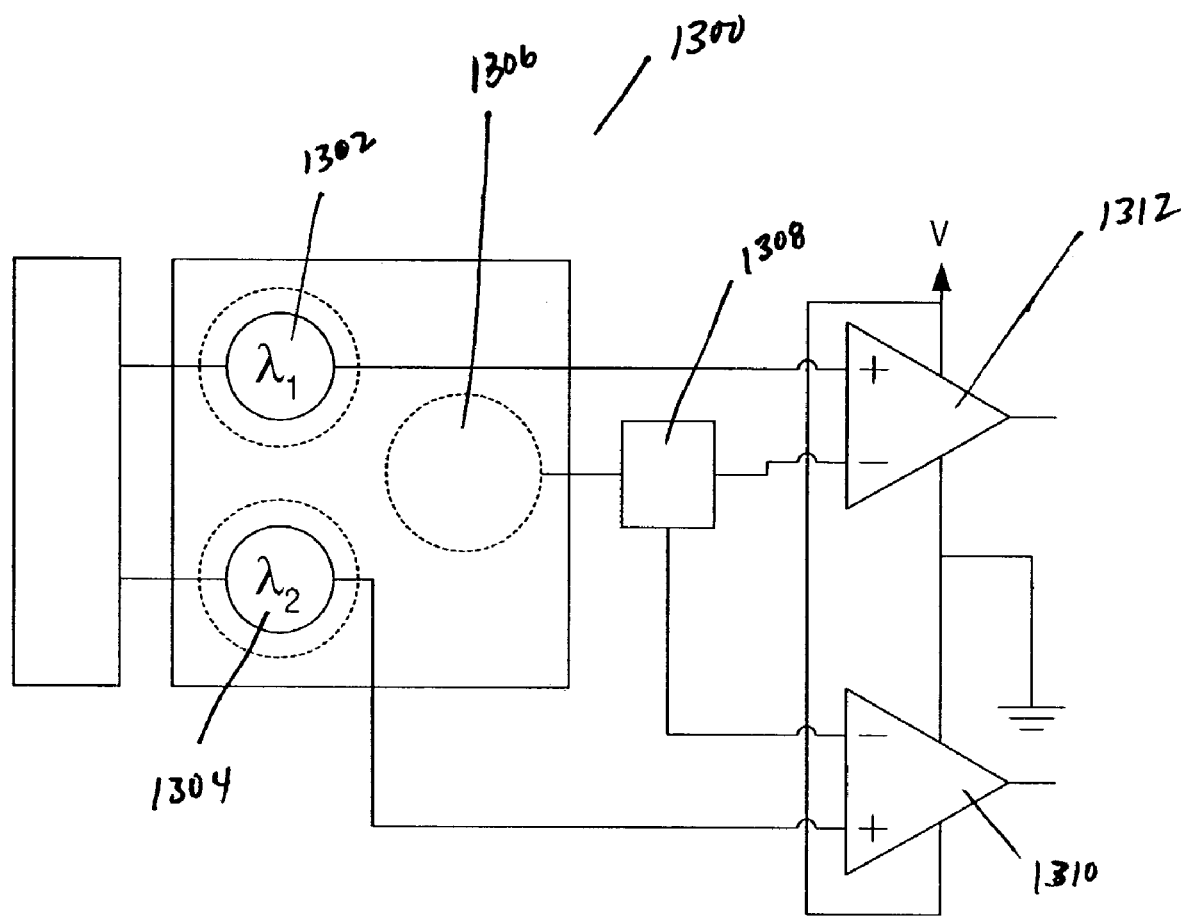
FIG. 13 illustrates another alternative configuration having two different wavelength-specific bright detectors each sharing a common dark detector.

In yet other alternative implementations employing the redundancy-related configurations of FIG. 11 or FIG. 12 the bright detectors are used, not for redundancy, but rather in an arrangement where one of the bright detectors is sensitive to a specific wavelength whereas another (or others) sensitive to different wavelength(s). Depending upon the particular case, this could be accomplished directly through the use of different photodetectors as the bright detectors or by adding some form of covering over each specific photodetector that is optically transparent at the desired wavelength but opaque as to others. This is shown in FIG. 13, which illustrates another alternative configuration 1300 having two different wavelength-specific bright detectors 1302, 1304 each sharing a common dark detector 1306. Thus, for each bright detector there is a separate subtraction circuit 1308, 1310. As a result, this approach could be used, for example, with two fibers each carrying a different wavelength of data-containing light or a single fiber carrying two different wavelengths of data-containing light. Each bright detector 1302, 1304 would receive the appropriate data and the output of the single dark detector 1306 would be split up, using appropriate known analog circuits 1308 or other design techniques, so as to be usable by the subtraction circuits 1310, 1312 (again represented for simplicity as differential amplifiers) for each to reduce the noise for each as described herein.

Up to now, the discussion has focussed on an optical receiver arrangement. However, it should be understood, that the above discussion of receivers is not intended to exclude the use in more complex circumstances, for example, as part of an optical transceiver unit or module (i.e. a unit or module designed to send as well as receive data).

Figure 14:
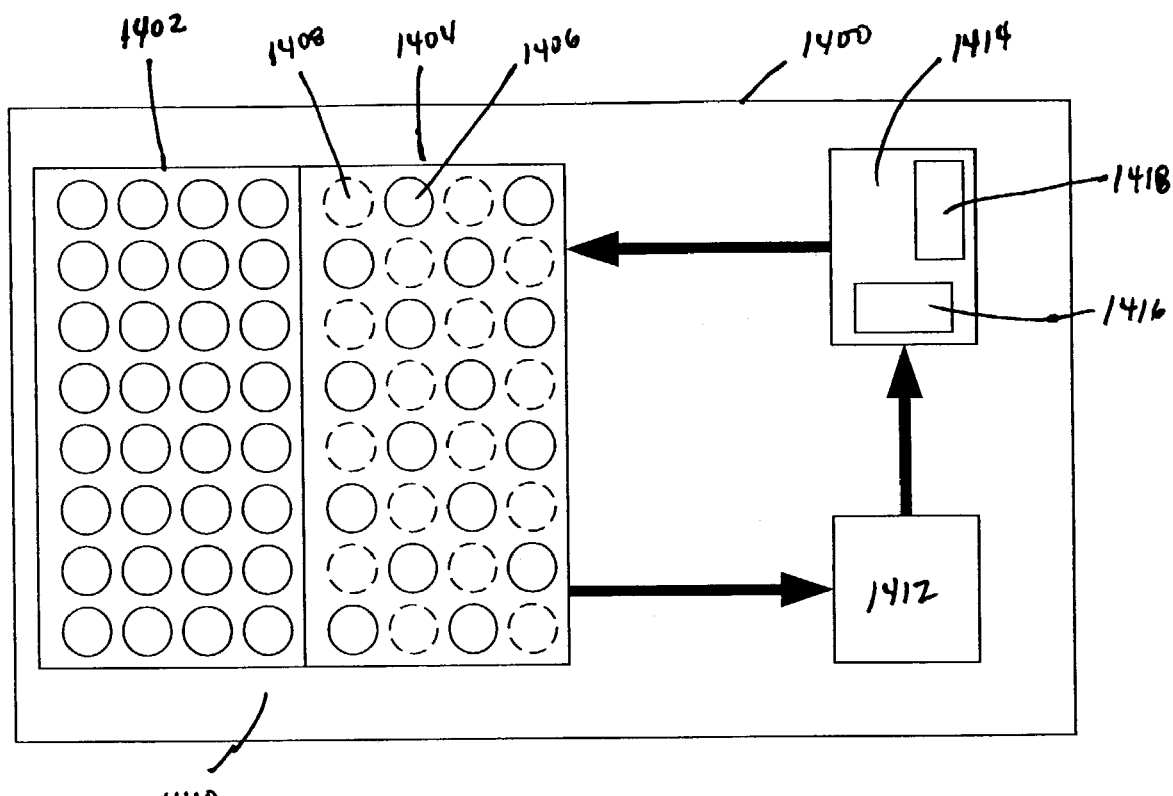
FIG. 14 illustrates in simplified fashion, an example optical transceiver implementation incorporating the invention.

FIG. 14 illustrates, in simplified fashion, an example optical transceiver 1400 implementation incorporating the invention. An array of thirty-two lasers 1402 provides for data transmission ability, whereas an array 1404 of detectors (comprising bright 1406 and dark 1408 detectors) provide data reception capability. The array of lasers 1402 and array of detectors 1404 is mounted on a carrier 1410, for example a circuit board or other medium that can be used to transmit electrical signals over a distance via wires, traces, etc. An electronic chip 1412 comprises the subtractor circuitry and is appropriately connected to the outputs of the bright 1406 and dark 1408 detectors. A second electronic chip 1414 comprises drive and control circuitry for both the laser array 1402 and detector array 1404 as well as other signal processing circuitry, for example, analog-to-digital conversion circuits 1416 and a programmed processor 1418. The subtractor circuitry chip 1412 is connected to the electronic chip 1414 so that the output of the subtractor chip 1412 can be received by and operated on in the electronic chip 1414 as desired.

Figure 15:
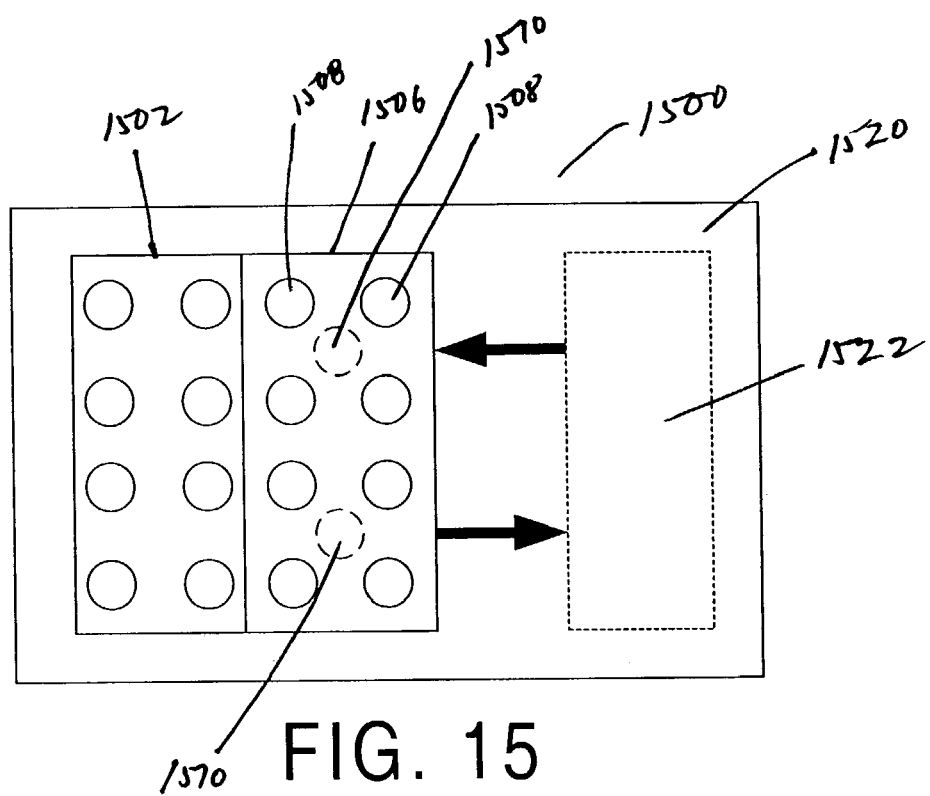
FIG. 15 illustrates in simplified fashion, yet another example optical transceiver implementation incorporating the invention.

FIG. 15 illustrates, in simplified fashion, yet another example optical transceiver 1500 implementation incorporating the invention. In this implementation, the transceiver 1500 comprises: i) a transmission array 1502 of eight individual lasers 1504, ii) a detector array 1506 comprising eight individual bright detectors 1508 and two dark detectors 1510, iii) an electronic chip 1520 to which the transmission array 1502 and detector array 1506 have all been hybridized, for example, as described in any of commonly assigned U.S. patent application Nos. 09/896,189, 09/896,665, 09/896,983, 09/897,158 or 09/897,160, the entirety of which are incorporated herein by reference. The electronic chip 1520 comprises drive and control circuitry (not shown) for the arrays 1502, 1506 as well as circuitry 1522 implementing the subtractor function described herein.

It should be understood that all of the implementation described in connection with FIG. 7 though FIG. 13 (inclusive) could be used in the transceiver of, for example, FIG. 14 of FIG. 15. In addition, the subtractor circuitry can be implemented using alternative analog circuits or digitally using appropriate analog to digital conversion techniques prior to subtracting the dark signal from the bright signal as digital values.

Having described a number of simple examples, it is to be understood that numerous more complex implementations can be created by use of different combinations or permutations of the above or by straightforward modification of the examples for the particular application or environment in which the invention is to be used. It should therefore be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. An optoelectronic device, comprising:
    a support surface;
    at least two bright photodetectors positioned on the support surface;
    a dark photodetector positioned on the support surface, wherein the dark photodetector is substantially identical to the at least two bright photodetectors and closely adjacent to the at least two bright photodetectors, and wherein:
        each of the at least two bright photodetectors has a receiver and an output, wherein each bright photodetector receiver is on a side opposite the support surface and is configured to receive light; and
        the dark photodetector has a receiver and an output, wherein the dark photodetector receiver is on the side opposite the support surface and is configured to not receive light; and
        a subtraction circuit, wherein the subtraction circuit is configured to be coupled to the output of only one of the at least two bright photodetectors at any given time, wherein the subtraction circuit is also configured to be coupled to the output of the dark photodetector, and wherein the subtraction circuit is configured to provide an electrical data signal that results from a subtraction of an electrical signal output by the dark photodetector from an electrical signal output by the only one of the at least two bright photodetectors.

2. The optoelectronic device of claim 1, further comprising an opaque covering positioned over the dark photodetector.

3. The optoelectronic device of claim 2, further comprising:
    an optical transmission element configured to direct a light beam toward the receivers of the at least two bright photodetectors and the receiver of the dark photodetector, wherein the light beam comprises an optical data signal; and
    one or more openings in the opaque covering between the optical transmission element and the at least two bright photodetectors, wherein the one or more openings are configured to allow the light beam to pass to the receiver of the at least two bright photodetectors.

4. The optoelectronic device of claim 2, wherein the opaque covering comprises a semiconductor substrate material.

5. The optoelectronic device of claim 1, further comprising an integrated circuit chip hybridized to the at least two bright photodetectors and the dark photodetector.

6. The optoelectronic device of claim 5, further comprising control circuitry within the integrated circuit chip, wherein the control circuitry is configured to control the at least two bright photodetectors and the dark photodetector.

7. The optoelectronic device of claim 6, wherein the integrated circuit chip further comprises the subtraction circuit.

8. The optoelectronic device of claim 5, wherein the integrated circuit chip further comprises the subtraction circuit.

9. The optoelectronic device of claim 1, wherein the at least two bright photodetectors and the dark photodetector are p-I-n photodiodes.

10. The optoelectronic device of claim 1, wherein the electrical signal output by the dark photodetector comprises a noise signal.

11. An optical unit, comprising:
    at least two bottom receiving bright detectors, wherein each of the bottom receiving bright detectors comprises an output;
    a bottom receiving dark detector, wherein the bottom receiving dark detector is positioned adjacent the at least two bottom receiving bright detectors and comprises an output, and wherein the at least two bright detectors and the bottom receiving dark detector are positioned on a common support surface and configured so that a light will be received by the at least two bottom receiving bright detectors and will not be received by the bottom receiving dark detector;
    at least two subtractors, wherein each subtractor comprises a first input and second input, and wherein:
        each output of the at least two bottom receiving bright detectors is coupled to a different one of the at least two subtractors, wherein the outputs of the at least two bottom receiving bright detectors are coupled to the first subtractor input;
        the output of the bottom receiving dark detector is coupled to a splitter comprising a plurality of outputs;
        each output of the splitter is coupled to a different one of the at least two subtractors, wherein each output of the splitter is coupled to the second subtractor input; and
        each subtractor is configured to output a signal that results from a subtraction of a signal input received by the second subtractor input from a signal input received by the first subtractor input.

12. The optical unit of claim 11, herein the subtractor comprises a differential amplifier circuit.

13. The optical unit of claim 11, wherein the subtractor comprises an integrated circuit chip hybridized to the at least two bottom receiving bright detectors and the bottom receiving dark detector.

14. An optical device, comprising:
   at least two photodetectors, wherein the at least two photodetectors each comprise a signal output and are configured so that only one of the at least two photodetectors will be active at a given time;
   a dark detector, wherein the dark detector comprises an output and is positioned in close proximity to the at least two photodetectors; and
   a circuit having a first input and a second input, wherein the first input is configured to receive a first signal from the active one of the at least two photodetectors, wherein the second input is configured to receive a second signal from the output of the dark detector, and wherein the circuit is configured to subtract the second signal from one of the first signal.

15. The optical device of claim 14, further comprising an electronic chip coupled to the at least two photodetectors and the dark detector, wherein the electronic chip comprises control circuitry that is configured to control which of the at least two photodetectors is active.

16. A method, comprising:
   outputting a first signal from each of a plurality of bottom receiving photodetectors;
   outputting a second signal from a dark detector;
   receiving the first signal from each of the plurality of bottom receiving photodetectors at a selection device;
   selecting one of the received first signals to output from the selection device;
   receiving a signal output from the selection device at a first input of a subtraction device;
   receiving the second signal at a second input of the subtraction device; and
   at the subtraction device, subtracting the second signal from the signal output of the selection device.

17. The method of claim 16, further comprising converting an optical data signal into the first signal at each of the plurality of bottom receiving photodetectors, wherein the optical data signal is received from an optical fiber.

18. The method of claim 16, further comprising outputting a noise reduced signal from the subtracting device.

19. The method of claim 18, wherein the selecting is performed by a control circuit.

20. The method of claim 16, wherein the dark detector comprises an antireflective opaque material.

21. A method, comprising:
   outputting a first signal from a first bottom receiving photodetector;
   outputting a dark signal from a bottom receiving dark detector;
   receiving the dark signal at a splitter;
   splitting the dark signal into a plurality of noise signals;
   receiving the first signal at a first input of a subtractor;
   receiving one of the plurality of noise signals at a second input of a subtractor;
   producing a noise-reduced first signal by subtracting one of the plurality of noise signals received at the second input of the subtractor from the first signal received at the first input of the subtractor.

22. The method of claim 21, wherein the plurality of noise signals are each received at different subtractors.

23. The method of claim 21, wherein the first bottom receiving photodetector is sensitive to a first wavelength, the method further comprising:
   outputting a second signal from a second bottom receiving photodetector, wherein the second bottom receiving photodetector is sensitive to a second wavelength different from the first wavelength; and
   producing a noise-reduced second signal by subtracting one of the plurality of noise signals from the second signal.

* * * * *

UNITED STATES PATENT AND TRADEMARK OFFICE
CERTIFICATE OF CORRECTION

| | | |
|---|---|---|
| PATENT NO. | : 7,620,330 B2 | Page 1 of 1 |
| APPLICATION NO. | : 10/456388 | |
| DATED | : November 17, 2009 | |
| INVENTOR(S) | : Faska et al. | |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 578 days Delete the phrase "by 578 days" and insert -- by 1205 days --

Signed and Sealed this

Third Day of August, 2010

David J. Kappos
*Director of the United States Patent and Trademark Office*